(12) United States Patent
Heo et al.

(10) Patent No.: US 9,753,501 B2
(45) Date of Patent: Sep. 5, 2017

(54) ELECTRICAL CONNECTION DEVICE AND ELECTRONIC DEVICE HAVING SAME

(71) Applicant: Samsung Electronics Co., Ltd., Gyeonggi-do (KR)

(72) Inventors: Joon Heo, Gyeonggi-do (KR); Yong-Hwa Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 14/802,309

(22) Filed: Jul. 17, 2015

(65) Prior Publication Data

US 2016/0018856 A1    Jan. 21, 2016

(30) Foreign Application Priority Data

Jul. 17, 2014    (KR) .......................... 10-2014-0090439

(51) Int. Cl.

| | |
|---|---|
| *G06F 1/16* | (2006.01) |
| *H05K 9/00* | (2006.01) |
| *H01Q 1/24* | (2006.01) |
| *H01Q 1/48* | (2006.01) |
| *H04M 1/02* | (2006.01) |

(52) U.S. Cl.
CPC .......... *G06F 1/1698* (2013.01); *G06F 1/1626* (2013.01); *G06F 1/1688* (2013.01); *G06F 1/1694* (2013.01); *H01Q 1/243* (2013.01); *H01Q 1/48* (2013.01); *H05K 9/0064* (2013.01); *H04M 1/0277* (2013.01); *H05K 9/0049* (2013.01)

(58) Field of Classification Search
CPC ........ H01Q 1/243; H01Q 1/50; G06F 1/1626; G06F 1/1656; H04B 1/3827; H04B 1/385
See application file for complete search history.

(56) References Cited

U.S. PATENT DOCUMENTS

| | | | | |
|---|---|---|---|---|
| 6,243,592 | B1 * | 6/2001 | Nakada ................. | H01Q 1/243 455/575.7 |
| 6,360,105 | B2 * | 3/2002 | Nakada ................. | H01Q 1/243 455/566 |
| 6,531,988 | B1 * | 3/2003 | Koyama ................ | G04B 47/00 343/700 MS |
| 7,466,275 | B2 | 12/2008 | Cheng | |
| 7,697,281 | B2 * | 4/2010 | Dabov ................. | G06F 1/1626 361/679.55 |
| 7,869,206 | B2 * | 1/2011 | Dabov ................. | G06F 1/1626 361/679.55 |

(Continued)

FOREIGN PATENT DOCUMENTS

KR    20120067518 A    6/2012

*Primary Examiner* — Robert J Hoffberg

(57) ABSTRACT

An electronic device includes a substrate, a structure arranged near the substrate and includes at least one electronic component, a conductive structure provided in the electronic device, and a conductor arranged in the structure, grounding the conductive structure to a ground of the substrate. Electronic components spaced within the electronic device are electrically connected to each other using the existing structure to be installed, so that a mounting space for preparing an electrical connector is prevented from being wasted, thereby making the electronic device slim. The embodiments according to the present disclosure can reduce the number of assembling processes and manufacturing costs.

14 Claims, 9 Drawing Sheets

(56) References Cited

U.S. PATENT DOCUMENTS

| | | | |
|---|---|---|---|
| 8,250,724 B2* | 8/2012 | Dabov | G06F 1/1626 |
| | | | 29/407.05 |
| 8,537,072 B2* | 9/2013 | Jensen | H01Q 1/243 |
| | | | 343/702 |
| 8,767,407 B2* | 7/2014 | Lim | H05K 9/0028 |
| | | | 174/359 |
| 8,851,907 B2 | 10/2014 | Kim | |
| 8,902,107 B2* | 12/2014 | Luke | G06F 1/1626 |
| | | | 343/702 |
| 9,318,802 B2* | 4/2016 | Smith | H01Q 1/50 |
| 9,502,752 B2* | 11/2016 | Darnell | H01Q 1/243 |
| 2008/0081658 A1 | 4/2008 | Cheng | |
| 2009/0224986 A1* | 9/2009 | Hotta | H01Q 9/42 |
| | | | 343/702 |
| 2010/0302108 A1* | 12/2010 | Luke | G06F 1/1626 |
| | | | 343/702 |
| 2012/0156903 A1 | 6/2012 | Kim | |
| 2013/0021280 A1* | 1/2013 | Dabov | G06F 1/1626 |
| | | | 345/173 |
| 2013/0215559 A1* | 8/2013 | Kim | H05K 5/0217 |
| | | | 361/679.01 |
| 2015/0245513 A1* | 8/2015 | Moon | G06F 1/20 |
| | | | 361/679.01 |
| 2016/0064810 A1* | 3/2016 | Smith | H01Q 1/50 |
| | | | 343/906 |
| 2016/0276757 A1* | 9/2016 | Smith | H01Q 1/50 |
| 2016/0330878 A1* | 11/2016 | Allore | G06F 1/1626 |

\* cited by examiner

ELECTRICAL CONNECTION DEVICE AND ELECTRONIC DEVICE HAVING SAME

CROSS-REFERENCE TO RELATED APPLICATION AND CLAIM OF PRIORITY

The present application is related to and claims benefit under 35 U.S.C. §119(a) to Korean Application Serial No. 10-2014-0090439, which was filed in the Korean Intellectual Property Office on Jul. 17, 2014, the entire content of which is hereby incorporated by reference.

TECHNICAL FIELD

Various embodiments of the present disclosure relate to an electronic device, e.g., an electronic device having an electrical connection device.

BACKGROUND

In recent, with the development of an electronic communication technology, electronic devices having various functions are appearing. These electronic devices generally have a convergence function for complexly performing one or more functions.

In particular, in a trend in which a functional gap between electronic devices, which are recently released by various manufacturers, is being reduced remarkably, the electronic devices have slimmed gradually, have an increased rigidity, and have a better design in order to satisfy a purchase desire of a user. As an aspect of such a trend, the outer appearances of the electronic devices are implemented by a metal material so that the electronic devices are advanced and the outer appearance thereof becomes more beautiful. In addition, there is an effort to resolve grounding, a decrease in an antenna radiation performance, etc. which are generated using the metal material.

SUMMARY

According to various embodiments, when the outer appearance of an electronic device is made of a conductive material, a conductive frame enclosing a terminal and a conductive bracket are integrally configured, so that the conductive frame may be used as an antenna. At this time, the conductive frame is electrically connected to a ground of a PCB in order to improve a performance of an antenna. However, in the configuration, a substrate of the electronic device and the ground of the PCB are connected to each other, so that the conductive frame may cause electric shock when the electronic device is charged. According to various embodiments, in order to reduce electric shock, a DC ground is shorted and the AC ground is electrically connected.

The ground of the substrate is configured by the DC ground and the AC ground, which correspond to a main ground. At this time, the DC ground is the conventional ground which means 0 potential of a circuit, and the AC ground is an independent ground separated from the DC ground. The AC ground may be used as an RF ground.

Meanwhile, in the related art, a separately-provided physical structure is used in order to electrically connect the conductive frame, a conductive cover, etc., which constitute the outer appearance of the electronic device, to the substrate arranged inside the electronic device. For example, a separate connecting body is arranged inside the electronic device and a connector or a connection pin provided in the corresponding connecting body is electrically connected to the substrate, the conductive frame, or the conductive cover.

However, in such a configuration, a separate mounting space for the connecting body should be provided inside the electronic device, which goes against a recent trend in which an electronic device becomes slim, light, short, and small. Further, since a separate structure for the ground should be provided, the number of assembling processes and manufacturing costs are increased.

To address the above-discussed deficiencies, it is a primary object to provide a configuration which can electrically connect the substrate and the conductive frame to each other using a structure in which an electronic component which necessarily exists in the related art is received.

According to various embodiments of the present disclosure, provided is a configuration which can electrically connect a first electronic component and a second electronic component to each other using an antenna part in which an antenna radiator is received.

According to various embodiments, provided is an electronic device having a structure which electrically connects the substrate and the conductive frame to each other using the antenna part in which the antenna radiator is received, thereby performing grounding.

According to various embodiments, an electronic device is provided. The electronic device includes: a substrate; a structure that is arranged near the substrate and comprises at least one electronic component; a conductive structure included in the electronic device; and a conductor that is arranged in the structure and grounds the conductive structure to a ground of the substrate.

According to various embodiments, an electronic device is provided. The electronic device includes: a substrate; an antenna part that is arranged near the substrate and comprises at least one antenna radiator; a conductive frame formed along an edge of the electronic device; and a conductor that is arranged in the antenna part and grounds the conductive frame to an AC ground of the substrate.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
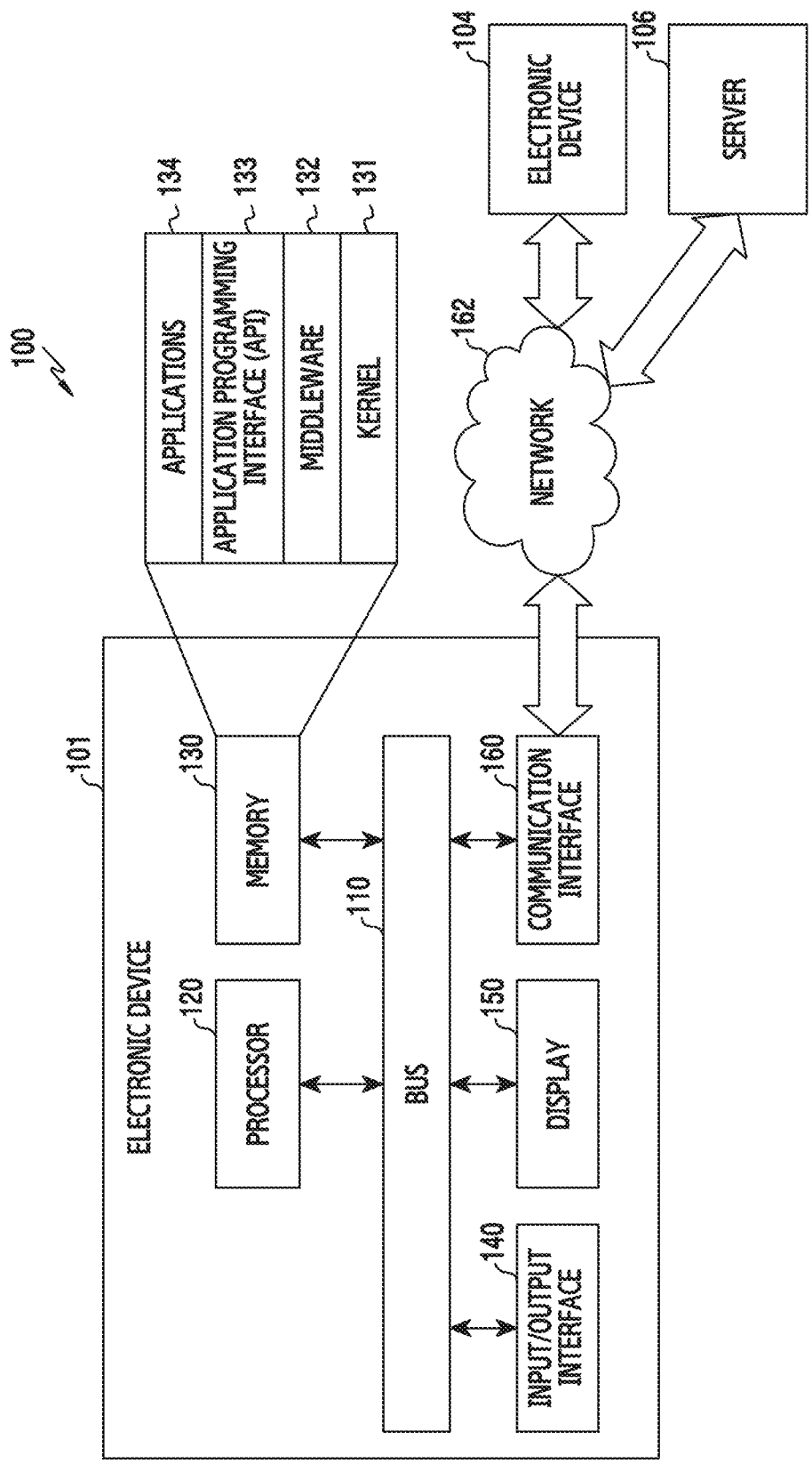
FIG. 1 illustrates a network environment including an electronic device according to various embodiments of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic devices. Hereinafter, various exemplary embodiments of the present disclosure are described with reference to the accompanying drawings. While the various exemplary embodiments of the present disclosure are susceptible to various modifications and alternative forms, a specific embodiment thereof has been shown by way of example in the drawings and will herein be described in detail. It should be understood, however, that it is not intended to limit the various exemplary embodiments of the present disclosure to the particular form disclosed, but, on the contrary, the various exemplary embodiments of the present disclosure are to cover all modifications, equivalent, and alternatives falling within the spirit and scope of the various exemplary embodiments of the present disclosure as defined by the appended claims. Like reference numerals denote like constitutional elements throughout the drawings.

The expression "include" or "may include" used in the various exemplary embodiments of the present disclosure is intended to indicate a presence of a corresponding function, operation, or constitutional element disclosed herein, and it is not intended to limit a presence of one or more functions, operations, or constitutional elements. In addition, in the various exemplary embodiments of the present disclosure, the term "include" or "have" is intended to indicate that characteristics, numbers, steps, operations, constitutional elements, and elements disclosed in the specification or combinations thereof exist. As such, the term "include" or "have" should be understood that there are additional possibilities of one or more other characteristics, numbers, steps, operations, constitutional elements, elements or combinations thereof.

In various exemplary embodiments of the present disclosure, an expression "or" includes any and all combinations of words enumerated together. For example, "A or B" may include A or B, or may include both of A and B.

Although expressions used in various exemplary embodiments of the present disclosure such as "$1^{st}$", "$2^{nd}$", "first", "second" may be used to express various constitutional elements of the various exemplary embodiments, it is not intended to limit the corresponding constitutional elements. For example, the above expressions are not intended to limit an order or an importance of the corresponding constitutional elements. The above expressions may be used to distinguish one constitutional element from another constitutional element. For example, a $1^{st}$ user device and the $2^{nd}$ user device are both user devices, and indicate different user devices. For example, a $1^{st}$ constitutional element may be termed a $2^{nd}$ constitutional element, and similarly, the $2^{nd}$ constitutional element may be termed the $1^{st}$ constitutional element without departing from the scope of the various exemplary embodiments of the present disclosure.

When a constitutional element is mentioned as being "connected" to or "accessing" another constitutional element, this may mean that it is directly connected to or accessing the other constitutional element, but it is to be understood that there are no intervening constitutional elements present. On the other hand, when a constitutional element is mentioned as being "directly connected" to or "directly accessing" another constitutional element, it is to be understood that there are no intervening constitutional elements present.

By the term "substantially" it is typically meant that the recited characteristic, parameter, or value need not be achieved exactly, but that deviations or variations, including but in no way limited to, for example, tolerances, measurement error, measurement accuracy limitations and other factors known to persons of ordinary skill in the art, may occur in amounts that do not preclude the effect the characteristic was intended to provide.

The terminology used in various exemplary embodiments of the present disclosure is for the purpose of describing particular exemplary embodiments only and is not intended to be limiting of the various exemplary embodiments of the present disclosure. A singular expression includes a plural expression unless there is a contextually distinctive difference therebetween.

Unless otherwise defined, all terms (including technical and scientific terms) used herein have the same meaning as commonly understood by those ordinarily skilled in the art to which various exemplary embodiments of the present disclosure belong. It will be further understood that terms, such as those defined in commonly used dictionaries, should be interpreted as having a meaning that is consistent with their meaning in the context of the relevant art and the various exemplary embodiments of the present disclosure, and will not be interpreted in an idealized or overly formal sense unless expressly so defined herein.

An electronic device according to various exemplary embodiments of the present disclosure may be a device including an antenna capable of performing a communication function in at least one frequency band. For example, the electronic device may be a smart phone, a tablet Personal Computer (PC), a mobile phone, a video phone, an e-book reader, a desktop PC, a laptop PC, a netbook computer, a Personal Digital Assistant (PDA), a Portable Multimedia Player (PMP), a MPEG-1 Audio Layer 3 (MP3) player, a mobile medical device, a camera, and a wearable device (e.g., a Head-Mounted-Device (HMD) such as electronic glasses, electronic clothes, an electronic bracelet, an electronic necklace, an electronic appcessory, an electronic tattoo, or a smart watch).

According to certain exemplary embodiments, the electronic device may be a smart home appliance having an antenna. For example, the smart home appliance may include at least one of a TeleVision (TV), a Digital Video Disk (DVD) player, an audio, a refrigerator, an air conditioner, a cleaner, an oven, a microwave oven, a washing machine, an air purifier, a set-top box, a TV box (e.g., Samsung HomeSync™, Apple TV™, or Google TV™), a game console, an electronic dictionary, an electronic key, a camcorder, and an electronic picture frame.

According to certain exemplary embodiments, the electronic device including the antenna may be one of various medical devices (e.g., Magnetic Resonance Angiography (MRA), Magnetic Resonance Imaging (MRI), Computed Tomography (CT), imaging equipment, ultrasonic instrument, etc.), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, and Point Of Sales (POS) of shops.

According to certain exemplary embodiments, the electronic device may be part of at least one of an item of furniture or a building/structure including an antenna. The electronic device may be an electronic board, an electronic signature input device, a projector, or any of various measurement machines (e.g., water supply, electricity, gas, propagation measurement machine, etc.). The electronic device may be one or more combinations of the aforementioned various devices. In addition, the electronic device may be a flexible device. Moreover, the electronic device is not limited to the aforementioned devices.

Hereinafter, an electronic device according to various exemplary embodiments will be described with reference to the accompanying drawings. The term 'user' used in the various exemplary embodiments may refer to a person who uses the electronic device or a device which uses the electronic device (e.g., an Artificial Intelligence (AI) electronic device).

FIG. 1 illustrates a network environment 100 including an electronic device 101 according to various exemplary embodiments. Electronic device 101 can include a bus 110, a processor 120, a memory 130, an input/output interface 140, a display 150, and a communication interface 160.

The bus 110 can be a circuit for connecting the aforementioned constitutional elements to each other and for delivering communication (e.g., a control message) between the aforementioned constitutional elements.

The processor 120 can receive an instruction from the aforementioned different constitutional elements (e.g., the memory 130, the input/output interface 140, the display 150, the communication interface 160, etc.), for example, via the bus 110, and thus can interpret the received instruction and execute arithmetic or data processing according to the interpreted instruction.

The memory 130 can store an instruction or data received from the processor 120 or different constitutional elements (e.g., the input/output interface 140, the display 150, the communication interface 160, etc.) or generated by the processor 120 or the different constitutional elements. The memory 130 can include programming modules such as a kernel 131, a middleware 132, an Application Programming Interface (API) 133, an application 134, and the like. Each of the aforementioned programming modules can consist of software, firmware, or hardware entities or can consist of at least two or more combinations thereof.

The kernel 131 can control or manage the remaining other programming modules, for example, system resources (e.g., the bus 110, the processor 120, the memory 130, etc.) used to execute an operation or function implemented in the middleware 132, the API 133, or the application 134. In addition, the kernel 131 can provide a controllable or manageable interface by accessing individual constitutional elements of the electronic device 101 in the middleware 132, the API 133, or the application 134.

The middleware 132 can perform a mediation role so that the API 133 or the application 134 communicates with the kernel 131 to exchange data. In addition, regarding task requests received from the application 134, for example, the middleware 132 can perform a control (e.g., scheduling or load balancing) for the task requests by using a method of assigning a priority capable of using a system resource (e.g., the bus 110, the processor 120, the memory 130, etc.) of the electronic device 101 to at least one of the applications 134.

The API 133 can include at least one interface or function (e.g., instruction) for file control, window control, video processing, character control, and the like, as an interface capable of controlling a function provided by the application 134 in the kernel 131 or the middleware 132.

The application 134 can include an Short Message Service (SMS)/Multimedia Messaging Service (MMS) application, an e-mail application, a calendar application, an alarm application, a health care application (e.g., an application for measuring a physical activity level, a blood sugar, etc.) or an environment information application (e.g., atmospheric pressure, humidity, or temperature information). Additionally or alternatively, the application 134 can be an application related to an information exchange between the electronic device 101 and an external electronic device (e.g., an electronic device 104 or server 106). The application related to the information exchange can include, for example, a notification relay application for relaying specific information to the external electronic device or a device management application for managing the external electronic device.

For example, the notification relay application can include a function of relaying notification information generated in another application (e.g., an SMS/MMS application, an e-mail application, a health care application, an environment information application, etc.) of the electronic device 101 to the external electronic device. Additionally or alternatively, the notification relay application can receive notification information, for example, from the external electronic device and can provide it to the user. The device management application can manage, for example, a function for at least one part of the external electronic device which communicates with the electronic device 101. Examples of the function include turning on/turning off the external electronic device itself (or some components thereof) or adjusting of a display illumination (or a resolution), and managing (e.g., installing, deleting, or updating) an application which operates in the external electronic device or a service (e.g., a call service or a message service) provided by the external electronic device.

The application 134 can include an application specified according to attribute information (e.g., an electronic device type) of the external electronic device. For example, if the external electronic device is an MP3 player, the application 134 can include an application related to a music play. Similarly, if the external electronic device is a mobile medical device, the application 134 can include an application related to a health care. The application 134 can include at least one of a specified application in the electronic device 101 or an application received from the external electronic device.

The input/output interface 140 can relay an instruction or data input from a user by using a sensor (e.g., an acceleration sensor, a gyro sensor) or an input device (e.g., a keyboard or a touch screen) to the processor 120, the memory 130, or the communication interface 160, for example, via the bus 110. For example, the input/output interface 140 can provide data regarding a user's touch input via the touch screen to the processor 120. In addition, the input/output interface 140 can output an instruction or data received from the processor 120, the memory 130, or the communication interface 160 to an output device (e.g., a speaker or a display), for example, via the bus 110. For example, the input/output interface 140 can output audio data provided by using the processor 120 to the user via the speaker.

The display 150 can display a variety of information (e.g., multimedia data or text data) to the user.

The communication interface 160 can connect a communication between the electronic device 101 and an external device (e.g., the electronic device 104 or the server 106). The communication interface 160 can include an antenna, examples of which are described hereinafter. For example, the communication interface 160 can communicate with the external device by being connected with a network 162 through wireless communication or wired communication. The wireless communication can include, for example, at least one of Wireless Fidelity (Wi-Fi), Bluetooth (BT), Near Field Communication (NFC), Global Positioning System (GPS), and cellular communication (e.g., LTE, LTE-A, CDMA, WCDMA, UMTS, WiBro, GSM, etc.). The wired communication can include, for example, at least one of Universal Serial Bus (USB), High Definition Multimedia Interface (HDMI), Recommended Standard (RS)-232, and Plain Old Telephone Service (POTS).

The network 162 can be a telecommunications network. The telecommunications network can include at least one of a computer network, an internet, an internet of things, and a telephone network. A protocol (e.g., a transport layer protocol, a data link layer protocol, or a physical layer protocol) for communication between the electronic device 101 and an external device can be supported in at least one of the application 134, the application programming interface 133, the middleware 132, the kernel 131, and the communication interface 160.

Figure 2:
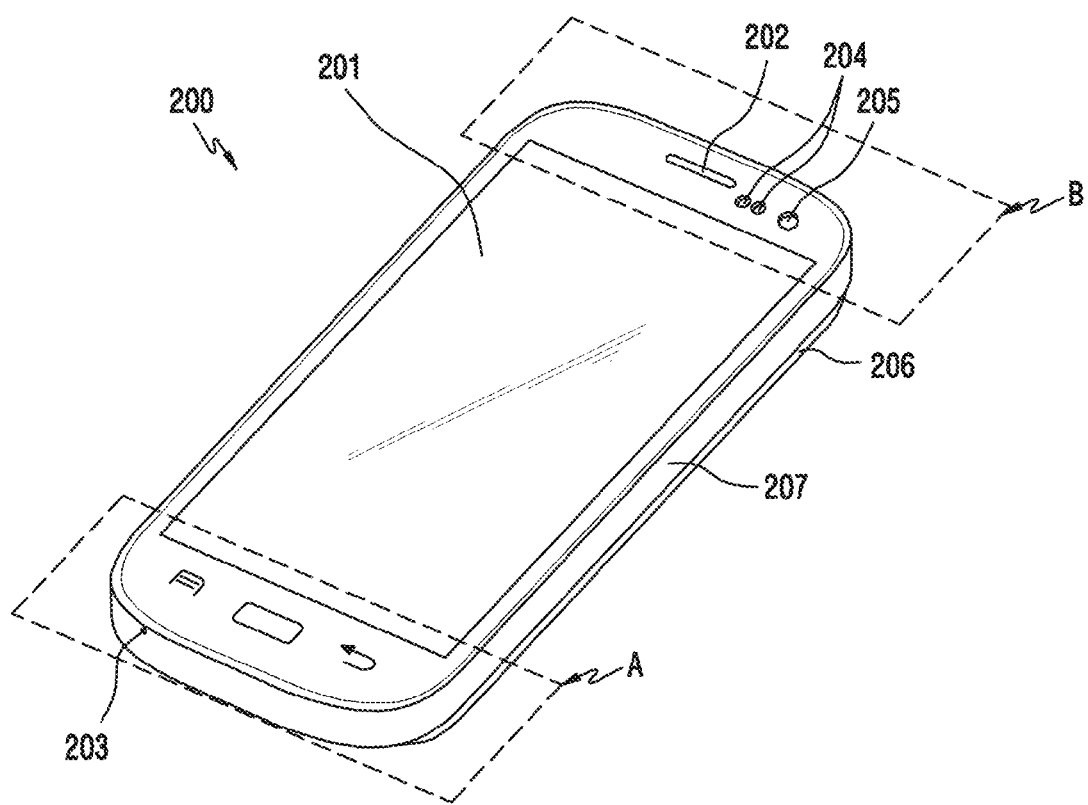
FIG. 2 is a perspective view illustrating an electronic device including a metal frame according to various embodiments of the present disclosure.

FIG. 2 is a perspective view illustrating an electronic device 200 including a conductive frame 207 according to various embodiments of the present disclosure.

Referring to FIG. 2, a display 201 can be installed on the front surface of the electronic device 200. A speaker apparatus 202 for receiving voice of a counterpart can be installed above the display 201. A microphone apparatus 203 for transmitting voice of a user of an electronic device to a counterpart can be installed below the display 201.

According to an embodiment, components for performing various functions of the electronic device 200 can be arranged near the speaker apparatus 202. The components include a first camera apparatus 205. Further, the components can include at least one sensor module 204. Such a sensor module 204 can include, for example, an illuminance sensor (e.g., an optical sensor) and/or a proximity sensor (e.g., an optical sensor). According to an embodiment, although not illustrated, the components further include at least one LED indicator.

Figure 4A:
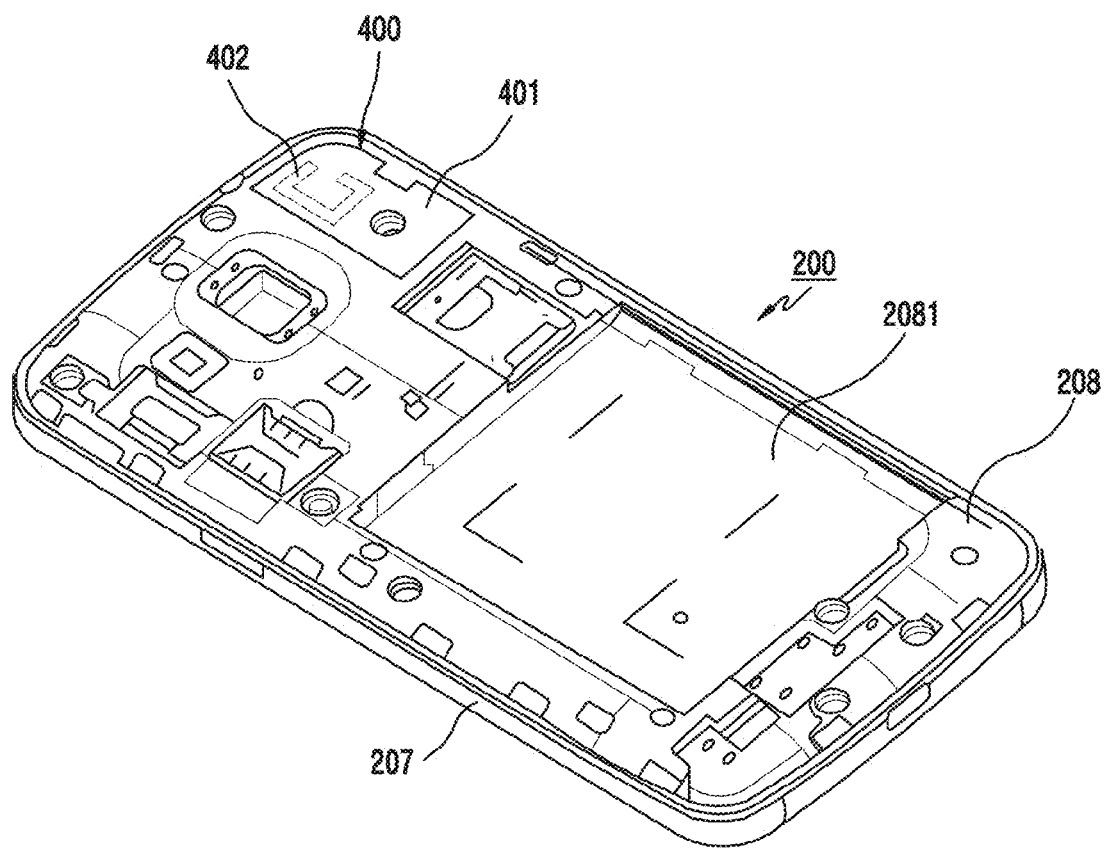
FIG. 4A is a rear perspective view illustrating an electronic device including an antenna part according to various embodiments of the present disclosure.

According to an embodiment, an antenna part 400 of FIG. 4A having an electrical connection function can be arranged in a region A or a region B of the electronic device 200 which is least affected when the electronic device 200 is gripped. However, the present disclosure is not limited thereto, and the antenna part 400 can be arranged on at least one of both side surfaces of the electronic device 200 except for the region A or the region B in the lengthwise direction.

According to various embodiments, the electronic device 200 can include a conductive frame 207 (or a metal housing) which serves as at least a part of the thickness of the electronic device 200 along an edge. According to an embodiment, the conductive frame 207 enhances the rigidity of the electronic device 200 and makes the outer appearance beautiful. According to an embodiment, the conductive frame 207 can be used as a part of the antenna part 400 arranged inside the electronic device 200 or can be grounded to a ground (e.g., an AC ground) of a substrate 500 (in FIG. 5) arranged inside the electronic device 200 in order to reduce noise of electronic components.

According to various embodiments, the conductive frame 207 can be electrically grounded (AC-grounded) by physically contacting the substrate by a conductor arranged in the antenna part 400.

Figure 3:
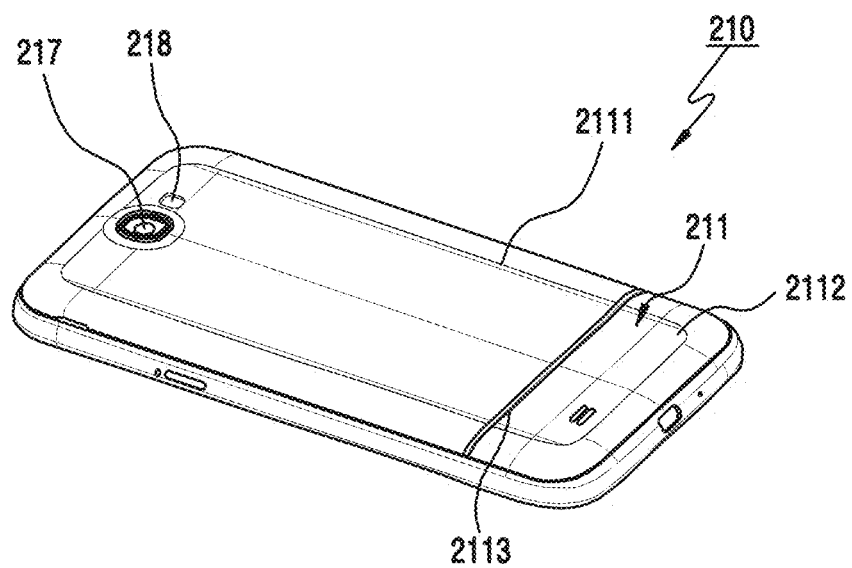
FIG. 3 is a perspective view illustrating an electronic device including a metal cover according to various embodiments of the present disclosure.

FIG. 3 is a perspective view illustrating an electronic device 210 including a conductive cover 211 according to various embodiments of the present disclosure.

Referring to FIG. 3, a camera apparatus 217 and a flash 218 can be arranged on the rear surface of the electronic device 210. According to an embodiment, the electronic device 210 can be configured such that the conductive cover 211 in addition to the conductive frame, which is arranged on the rear surface of the electronic device 210, can be grounded to the substrate of the electronic device 210. In this case, the conductive cover 211 can serve as a battery cover of the electronic device 210. According to an embodiment, in the conductive cover 211, a first cover 2111 and a second cover 2112 can be separately mounted by a gap 2113. According to an embodiment, only the second cover 2112 can be made of a conductive material. According to an embodiment, only the first cover 2111 can be made of a conductive material. According to an embodiment, both the first cover 2111 and the second cover 2112 can be made of a conductive material. In the aforementioned cases, at least one of the covers 2111 and 2112 can be physically or electrically connected to the substrate arranged inside the electronic device 210 by a conductor provided in a structure in which at least one electronic component arranged inside the electronic device 210 is received. According to an embodiment, in the aforementioned cases, at least one of the covers 2111 and 2112 can be physically or electrically connected to the substrate arranged inside the electronic device 210 by a conductor provided in an antenna part in which at least one antenna radiator arranged inside the electronic device 210 is received.

FIG. 4A is a rear perspective view illustrating an electronic device 200 including an antenna part 400 according to various embodiments of the present disclosure.

FIG. 4A is a view illustrating a state in which a battery cover (not illustrated) detachably installed on the rear surface of the electronic device 200 is separated, and the antenna part 400 can be arranged in at least a part of a battery cover mounting surface 208. According to an embodiment, the antenna part 400 can be arranged such that a first surface 401 is exposed to the battery cover mounting surface 208. According to an embodiment, the antenna part 400 can be arranged such that a first surface 401 is not exposed to the battery cover mounting surface 208. According to an embodiment, the antenna part 400 can be arranged such that a first surface 401 is not exposed to the battery cover mounting surface. Additionally, a battery pack mounting part 2081 can be installed on the battery cover mounting surface 208.

According to various embodiments, the antenna part 400 can include at least one antenna radiator 402. According to an embodiment, the antenna radiator 402, which is a communication means for the electronic device 200, can be configured to operate in at least one frequency bandwidth. According to an embodiment, the antenna part 400 can include a conductor 404 shown in FIG. 4B. According to an embodiment, the conductor 404 can ground the conductive frame 207 of the electronic device 200 to the ground (shown in FIG. 5) of the substrate 500 inside the electronic device 210 (e.g., AC-grounding) only by arranging the antenna part 400 without a separate connection structure.

Figure 4B:
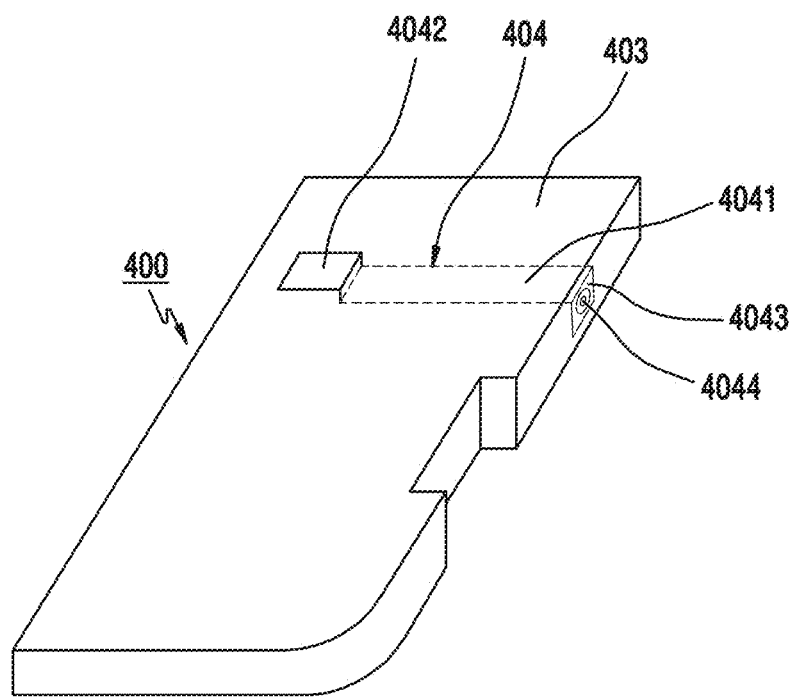
FIG. 4B a rear perspective view illustrating an antenna part of FIG. 4A according to various embodiments of the present disclosure.

FIG. 4B a rear perspective view illustrating an antenna part 400 of FIG. 4A according to various embodiments of the present disclosure.

Referring to FIG. 4B, at least a part of the conductor 404 can be arranged on a second surface 403 corresponding to a first surface 401 of the antenna part 400, to be exposed. Thus, the conductive frame 207 of the electronic device 200 can be electrically connected to the substrate 500 (shown in FIG. 5) of the electronic device 200 using the antenna part 400. In this case, the antenna part 400 further includes a separate conductor 404 for electrically connecting the conductive frame 207 and the substrate 500 in addition to the antenna radiator 402. However, the present disclosure is not limited thereto, and the antenna part 400 can perform an electrical connection function by itself without a separate conductor in a range in which a radiation performance is not inhibited.

According to various embodiments, the conductor 404 can include a connection part 4041 which is fixed to the antenna part 400 and has a constant length. One end and the other end of the connection part 4041 can serve as a connection means and can be arranged to be exposed to the outside of the antenna part 400. According to an embodiment, the one end of the connection part 4041 serves as a substrate connection part 4042 which can be physically in contact with the ground of the substrate 500. The other end of the connection part 4041 can serve as a frame connection part 4043 which can be physically in contact with the conductive frame 207. According to an embodiment, an embossing 4044 protruding in a direction of the conductive frame 207 is formed in the frame connection part 4043 so that a physical contact with the conductive frame 207 can be effectively induced. According to an embodiment, the connection part 4041 of the conductor 404 can be insert-molded to the antenna part 400. According to an embodiment, the connection part 4041 can be attached to the outside of the antenna part 400. According to an embodiment, the connection part 4041 can be double-injected with the antenna part 400. According to an embodiment, the connection part 4041 can be arranged such that conductive spray is applied to the outer surface of the antenna part 400.

According to various embodiments, the antenna part 400 can include at least one of an In-Mold Antenna (IMA), a Laser Direct Structuring (LDS), and an antenna carrier to which a metal material (e.g., SUS, etc.) as a double-injection or antenna radiator is attached and which is made of a dielectric material. According to an embodiment, the conductor 404 can be a dummy pattern which is formed in the same scheme as that of the antenna radiator 402 arranged in the antenna part 400. According to an embodiment, the conductor 404 can be formed in the same scheme as that of the antenna radiator 402 formed in the antenna part 400. According to an embodiment, the conductor 404 can be formed in a scheme different from that of the antenna radiator 402 formed in the antenna part 400. According to an embodiment, the antenna radiator 402 can be used as both a radiator operating in a predetermined frequency bandwidth and a conductor which electrically connects the conductive frame 207 and the substrate 500 to each other.

Figure 5:
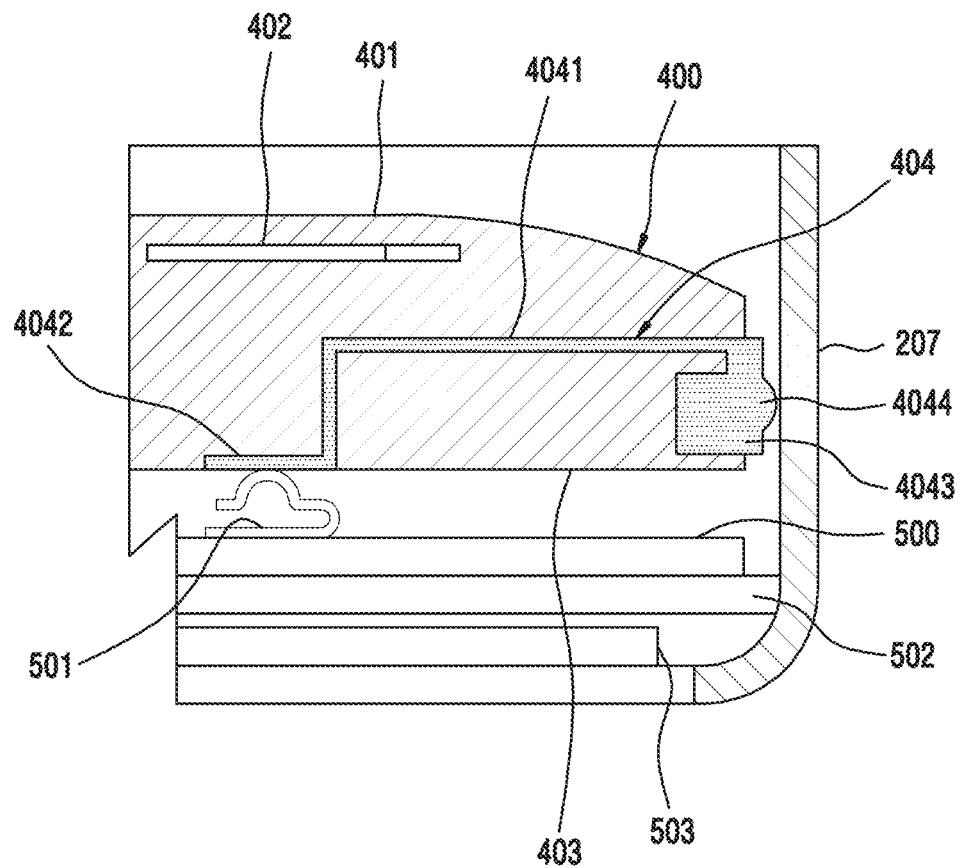
FIG. 5 is a partially sectional view illustrating a state in which a metal frame is grounded to a substrate by an antenna part according to various embodiments of the present disclosure.

FIG. 5 is a partial sectional view illustrating a state in which a conductive frame 207 is grounded to the ground of a substrate 500 by an antenna part 400 according to various embodiments of the present disclosure.

Referring to FIG. 5, the substrate 500 can be arranged on the bottom of the antenna part 400. The antenna part 400 can include an antenna radiator 402 and a conductor 404 which is arranged therebelow. A connection part 4041 of the conductor 404 can be arranged in the antenna part 400 in an insert-molding scheme or an in-mold scheme. A substrate connection part 4042 of the connection part 4041 can be physically in contact with the substrate 500, and a frame connection part 4043 of the connection part 4041 can be physically in contact with the conductive frame 207 formed to be the outer appearance of the electronic device.

According to various embodiments, the substrate 500 further includes a separate electrical connection means 501 for making a physical contact with the substrate connection part 4042 exposed to a second surface 403 of the antenna part 400 smooth. According to an embodiment, the electrical connection means 501 can include at least one of a conductive connector, a pogo pin, a conductive tape, a conductive C clip, and a conductive PORON tape. However, the present disclosure is not limited thereto, and the substrate connection part 4042 itself can be formed to have a connector shape protruding from the antenna part 400.

According to various embodiments, the frame connection part 4043 of the connection part 4041 are arranged to be exposed to the side surface of the antenna part 400 so as to be in close contact with the inner surface of the conductive frame 207 serving as the side surface of the outer appearance of the electronic device. According to an embodiment, the frame connection part 4043 includes an embossing 4044 protruding in a direction of the conductive frame 207 in a predetermined height and helps smooth contact with the conductive frame 207.

According to various embodiments of the present disclosure, not a separate structure for electric connection but a necessarily existing structure (e.g., the antenna part 400) is used in order to allow the conductive frame 207 to be grounded to the ground of the substrate 500, so that a mounting space is not unnecessarily wasted, thereby allowing the electronic device to slim, and a separate component is excluded so as to reduce the number of assembling processes and manufacturing costs.

According to various embodiments, the conductor 404 can electrically connect the conductive frame 207 and the AC ground of the substrate 500. According to an embodiment, the electronic device can include a conductive bracket 502 and a display 503. According to an embodiment, the conductive frame 207 and the conductive bracket 502 are not electrically connected to each other, and the conductive frame 207 can be grounded to the AC ground of the substrate 500 through the conductor 404. According to an embodiment, the conductive bracket 502 can be grounded to the DC ground (not illustrated) of the substrate 500.

Figure 6:
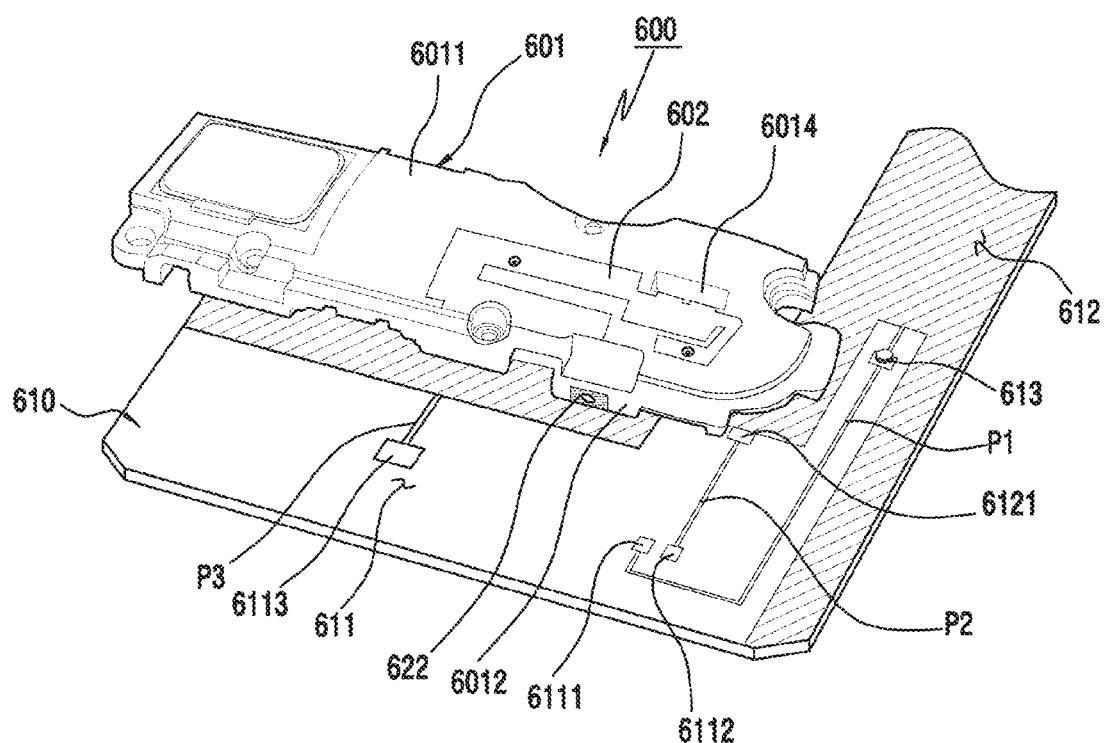
FIG. 6 is a cut-away perspective view illustrating an antenna apparatus in which an antenna part is installed on a substrate according to various embodiments of the present disclosure.
Figure 7:
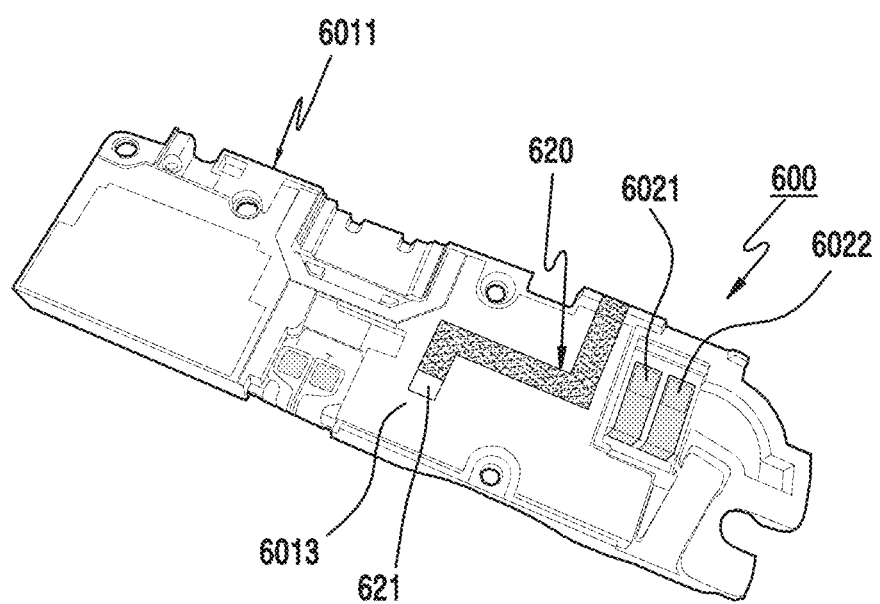
FIG. 7 is a rear perspective view illustrating an antenna part of FIG. 6 according to various embodiments of the present disclosure.

FIG. 6 is a cut-away perspective view illustrating an antenna apparatus 600 in which an antenna part 601 is installed on a substrate 610 according to various embodiments of the present disclosure. FIG. 7 is a rear perspective view illustrating an antenna part of FIG. 6 according to various embodiments of the present disclosure.

Referring to FIGS. 6 and 7, the antenna apparatus 600 can include a substrate 610 and an antenna part 601 (e.g., an antenna carrier) mounted on the substrate 610.

According to various embodiments, the substrate 610 can be a hard-type substrate or a soft-type substrate such as a Flexible Printed Circuit Board (FPCB). According to an embodiment, the substrate 610 can include a grounded area (conductive area) 612 and an ungrounded area (non-conductive area) 611. An antenna part 601 can be arranged in the ungrounded area 611.

According to an embodiment, the ungrounded area 611 of the substrate 610 can include a feeding pad 6111 and a grounding pad 6112 which are to be electrically connected to an antenna radiator 602. According to an embodiment, the ungrounded area 611 can include a conductor grounding pad 6113 electrically connected by a grounding line P3 in order to physically contact a substrate connection part 621 of a conductor 620 arranged on a bottom surface 6013 of the antenna part 601. The feeding pad 6111 is electrically connected to an RF connector 613 arranged on the ungrounded area 611 of the substrate 610, by a feeding line P1, and the grounding pad 6112 is electrically connected to a grounding part 6121 arranged in the grounding area 612 of the substrate 610 by a grounding line P2.

According to various embodiments, the antenna part 601 can include an upper surface 6011 and a side surface 6012 extending in a constant length along an edge of the upper surface 6011. According to an embodiment, the side surface 6012 gives a constant height to the antenna part 601, thereby achieving a smooth radiating performance of the antenna radiator 602.

According to an embodiment, the antenna radiator 602 can be arranged on the upper surface 6011 of the antenna part 601. The antenna radiator 602 can be made of a conductive material. According to an embodiment, the antenna radiator 602 can be fixed to the upper surface 6011 of the antenna part 601 made of a synthetic resin material in an insert-molding scheme. According to an embodiment, the antenna radiator 602 can be arranged to be attached to the upper surface 6011 of the antenna part 601. According to an embodiment, at least one of a metal plate in which a radiation pattern is formed and a flexible printed circuit including a radiation pattern can be used as the antenna radiator 602.

According to an embodiment, a pin inlet hole 6014 is formed through the antenna part 601 from the upper surface 6011 to the bottom surface 6013, and thus, a feeding pin 6021 and a grounding pin 6022 of the antenna radiator 602 pass through the pin inlet hole 6014 to be exposed to the bottom surface 6013.

According to various embodiments, the conductor 620 can be arranged on the bottom surface 6013 of the antenna part 601. According to an embodiment, only the substrate connection part 621 of the conductor 620 is exposed on the bottom surface 6013 or the entirety of the conductor 620 is exposed on the bottom surface 6013. According to an embodiment, a frame connection part 622 of the conductor 620 can be arranged in a scheme in which the conductor 620 is bypassed from the bottom surface 6013 of the antenna part 601 to the side surface 6012 of the antenna part 601. Also, although not numbered, the frame connection part 622 can include an embossing for smoothly performing contact with a conductive frame.

According to various embodiments of the present disclosure, the antenna part is used as a structure including the conductor, but the present disclosure is not limited thereto. For example, the existing structure (e.g., an assembly) in which at least one electronic component which can be included in an electronic device is provided together can be applied as the aforementioned structure. According to an embodiment, such electronic components can include at least one of a speaker module, a microphone module, a vibrator, and various sensor modules.

According to various embodiments of the present disclosure, electronic components spaced within an electronic device are electrically connected to each other using the existing structure such as the antenna part, so that a mounting space for preparing a separate electrical connecting body is prevented from being wasted, thereby making the electronic device slim. Therefore, the present disclosure can reduce the number of assembling processes and manufacturing costs.

Figure 8:
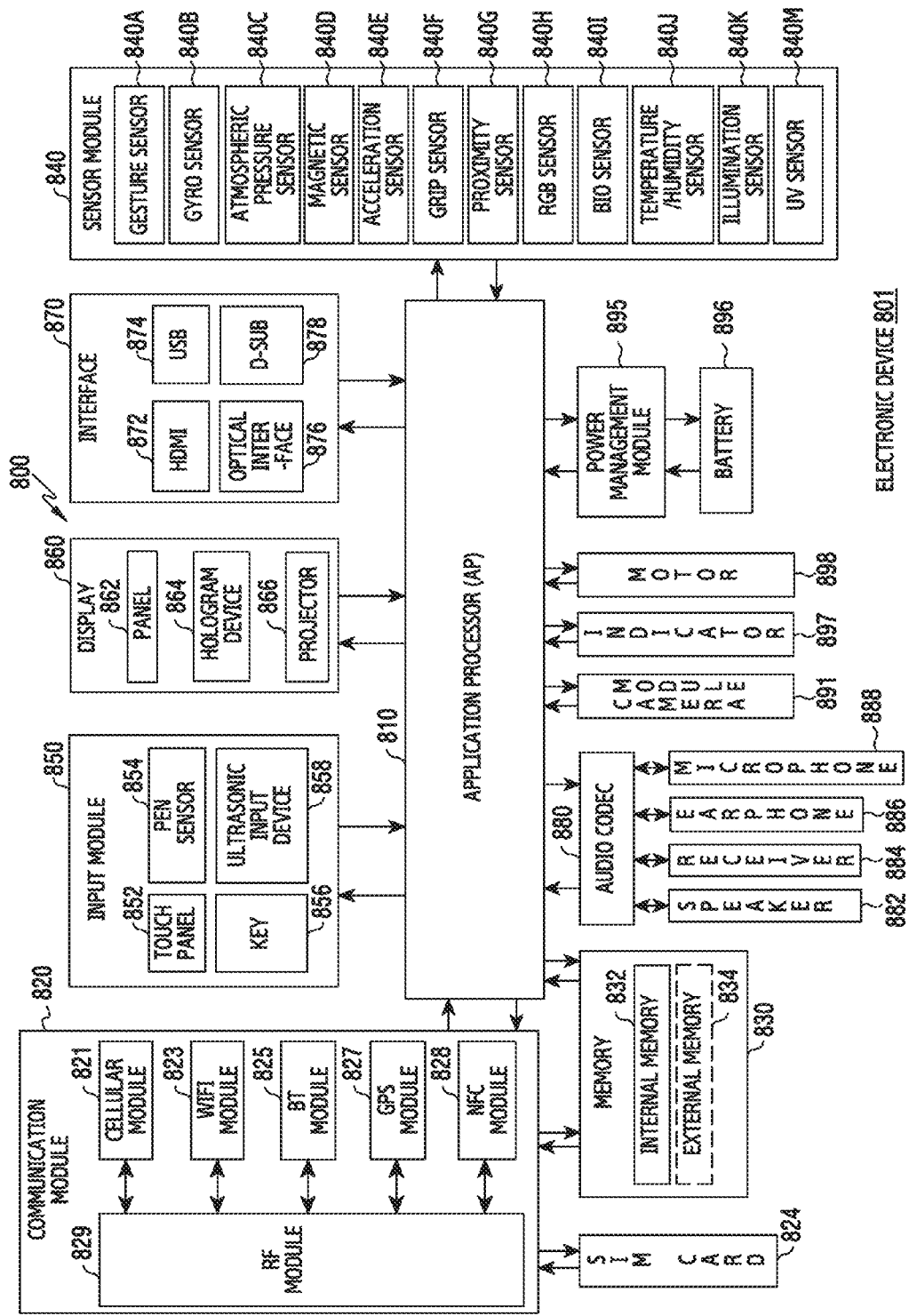
FIG. 8 is a block diagram illustrating an electronic device according to various embodiments of the present disclosure.

FIG. 8 illustrates a block diagram 800 of an electronic device 801 according to various exemplary embodiments of the present disclosure. As shown in FIG. 8, the electronic device 801 can entirely or partially constitute, for example, the electronic device 101 of FIG. 1, the device 300 of FIG. 2B. Electronic device 801 includes at least one Application Processor (AP) 810, a communication module 820, a Subscriber Identification Module (SIM) card 824, a memory 830, a sensor module 840, an input unit 850, a display 860, an interface 870, an audio module 880, a camera module 891, a power management module 895, a battery 896, an indicator 897, and a motor 898.

The AP 810 can control a plurality of hardware or software constitutional elements connected to the AP 810 by driving an operating system or an application program, and can process a variety of data including multimedia data and can perform an arithmetic operation. The AP 810 can be implemented, for example, with a System on Chip (SoC). The AP 810 can further include a Graphic Processing Unit (GPU, not shown).

The communication module 820 (e.g., the communication interface 160) can perform data transmission/reception in communication between other electronic devices (e.g., the electronic device 104 or the server 106) connected with the electronic device 801 (e.g., the electronic device 101) through a network. The communication module 820 can include a cellular module 821, a Wi-Fi module 823, a BlueTooth (BT) module 825, a Global Positioning System (GPS) module 827, a Near Field Communication (NFC) module 828, and a Radio Frequency (RF) module 829.

The cellular module 821 can provide a voice call, a video call, a text service, an internet service, and the like through a communication network (e.g., LTE, LTE-A, CDMA, WCDMA, UMTS, WiBro, GSM, etc.). In addition, the cellular module 821 can identify and authenticate the electronic device within the communication network by using a subscriber identity module (e.g., the SIM card 824). The cellular module 821 can perform at least some of functions that can be provided by the AP 810. For example, the cellular module 821 can perform at least some of multimedia control functions.

In some embodiments, the cellular module 821 can include a Communication Processor (CP). Further, the cellular module 821 can be implemented, for example, with an SoC. Although constitutional elements such as the cellular module 821 (e.g., the communication processor), the memory 830, the power management module 895, and the like are illustrated as separate constitutional elements with respect to the AP 810 in FIG. 8, the AP 810 can also be implemented such that at least one part (e.g., the cellular module 821) of the aforementioned constitutional elements is included.

In some embodiments, the AP 810 or the cellular module 821 (e.g., the communication processor) can load an instruction or data, which is received from each non-volatile memory connected thereto or at least one of different constitutional elements, to a volatile memory and can process the instruction or data. In addition, the AP 810 or the cellular module 821 can store data, which is received from at least one of different constitutional elements or generated by at least one of different constitutional elements, into the non-volatile memory.

Each of the WiFi module 823, the BT module 825, the GPS module 827, and the NFC module 828 can include, for example, a processor for processing data transmitted/received through a corresponding module. Although the cellular module 821, the WiFi module 823, the BT module 825, the GPS module 827, and the NFC module 828 are illustrated in FIG. 8 as separate blocks, according to one exemplary embodiment, at least some (e.g., two or more) of the cellular module 821, the WiFi module 823, the BT module 825, the GPS module 827, and the NFC module 828 can be included in one Integrated Chip (IC) or IC package. For example, at least some of processors corresponding to the cellular module 821, the WiFi module 823, the BT module 825, the GPS module 827, and the NFC module 828 (e.g., a communication processor corresponding to the cellular module 821 and a WiFi processor corresponding to the WiFi module 823) can be implemented with an SoC.

The RF module 829 can serve to transmit/receive data, for example, to transmit/receive an RF signal. Although not shown, the RF module 829 can include, for example, a transceiver, a Power Amp Module (PAM), a frequency filter, a Low Noise Amplifier (LNA), and the like. In addition, the RF module 829 can further include a component for transmitting/receiving a radio wave on a free space in wireless communication, for example, a conductor, a conducting wire, and the like. Although it is illustrated in FIG. 8 that the cellular module 821, the WiFi module 823, the BT module 825, the GPS module 827, and the NFC module 828 share one RF module 829, according to one exemplary embodiment, at least one of the cellular module 821, the WiFi module 823, the BT module 825, the GPS module 827, the NFC module 828 can transmit/receive an RF signal via a separate RF module.

The SIM card 824 can be a card in which a SIM is implemented, and can be inserted to a slot formed at a specific location of the electronic device. The SIM card 824 can include unique identification information (e.g., an Integrated Circuit Card IDentifier (ICCID)) or subscriber information (e.g., an International Mobile Subscriber Identity (IMSI)).

The memory 830 (e.g., the memory 130) can include an internal memory 832 or an external memory 834. The internal memory 832 can include, for example, at least one of a volatile memory (e.g., a Dynamic RAM (DRAM), a Static RAM (SRAM), a Synchronous Dynamic RAM (SDRAM), etc.) or a non-volatile memory (e.g., a One Time Programmable ROM (OTPROM), a Programmable ROM (PROM), an Erasable and Programmable ROM (EPROM), an Electrically Erasable and Programmable ROM (EEPROM), a Mask ROM, a Flash ROM, a NAND flash memory, a NOR flash memory, etc.).

The internal memory 832 can be a Solid State Drive (SSD). The external memory 834 can further include a flash drive, and can further include, for example, Compact Flash (CF), Secure Digital (SD), Micro Secure Digital (Micro-SD), Mini Secure digital (Mini-SD), extreme Digital (xD), memory stick, and the like. The external memory 834 can be operatively coupled to the electronic device 801 via various interfaces. The electronic device 801 can further include a storage unit (or a storage medium) such as a hard drive.

The sensor module 840 can measure a physical quantity or detect an operation state of the electronic device 801, and thus can convert the measured or detected information into an electric signal. The sensor module 840 can include, for example, at least one of a gesture sensor 840A, a gyro sensor 840B, a pressure sensor 840C, a magnetic sensor 840D, an acceleration sensor 840E, a grip sensor 840F, a proximity sensor 840G, a color sensor 840H (e.g., a Red, Green, Blue (RGB) sensor), a bio sensor 840I, a temperature/humidity sensor 840J, an illumination sensor 840K, and an Ultra Violet (UV) sensor 840M. Additionally or alternatively, the sensor module 840 can include, for example, an E-node sensor (not shown), an ElectroMyoGraphy (EMG) sensor (not shown), an ElectroEncephaloGram (EEG) sensor (not shown), an ElectroCardioGram (ECG) sensor (not shown), a fingerprint sensor, etc. The sensor module 840 can further include a control circuit for controlling at least one or more sensors included therein.

The input module 850 can include a touch panel 852, a (digital) pen sensor 854, a key 856, or an ultrasonic input unit 858. The touch panel 852 can recognize a touch input, for example, by using at least one of an electrostatic type, a pressure-sensitive type, and an ultrasonic type. The touch panel 852 can further include a control circuit. In case of the electrostatic type, not only a physical contact but also a proximity recognition is also possible. The touch penal 852 can further include a tactile layer. In this case, the touch panel 852 can provide the user with a tactile reaction.

The (digital) pen sensor 854 can be implemented, for example, by using the same or similar method of receiving a touch input of the user or by using an additional sheet for recognition. The key 856 can be, for example, a physical button, an optical key, a keypad, or a touch key. The ultrasonic input unit 858 is a device by which the electronic device 801 detects a sound wave through a microphone (e.g., a microphone 888) by using a pen which generates an ultrasonic signal, and is a device capable of radio recognition. The electronic device 801 can use the communication module 820 to receive a user input from an external device (e.g., a computer or a server) connected thereto.

The display 860 (e.g., the display 150) can include a panel 862, a hologram 864, or a projector 866. The panel 862 can be, for example, a Liquid-Crystal Display (LCD), an Active-Matrix Organic Light-Emitting Diode (AM-OLED), etc. The panel 862 can be implemented, for example, in a flexible, transparent, or wearable manner. The panel 862 can be constructed as one module with the touch panel 852. The hologram 864 can use an interference of light and show a stereoscopic image in the air. The projector 866 can display an image by projecting a light beam onto a screen. The screen can be located, for example, inside or outside the electronic device 801. The display 860 can further include a control circuit for controlling the panel 862, the hologram 864, or the projector 866.

The interface 870 can include, for example, a High-Definition Multimedia Interface (HDMI) 872, a Universal Serial Bus (USB) 874, an optical communication interface 876, or a D-subminiature (D-sub) 878. The interface 870 can be included, for example, in the communication interface 160 of FIG. 1. Additionally or alternatively, the interface 870 can include, for example, Mobile High-definition Link (MHL) (not shown), Secure Digital (SD)/Multi-Media Card (MMC) (not shown) or Infrared Data Association (IrDA) (not shown).

The audio module 880 can bilaterally convert a sound and electric signal. At least some constitutional elements of the audio module 808 can be included in, for example, the input/output interface 140 of FIG. 1. The audio module 880 can convert sound information which is input or output, for example, through a speaker 882, a receiver 884, an earphone 886, the microphone 888, and the like.

The camera module 891 is a device for image and video capturing, and according to one exemplary embodiment, can include one or more image sensors (e.g., a front sensor or a rear sensor), a lens (not shown), an Image Signal Processor (ISP) (not shown), or a flash (not shown, e.g., LED or xenon lamp).

The power management module 895 can manage power of the electronic device 801. Although not shown, the power management module 895 can include, for example, a Power Management Integrated Circuit (PMIC), a charger Integrated Circuit (IC), or a battery fuel gauge.

The PMIC can be placed, for example, inside an IC or SoC semiconductor. Charging can be classified into wired charging and wireless charging. The charger IC can charge a battery, and can avoid an over-voltage or over-current flow from a charger. The charger IC can further include a charger IC for at least one of the wired charging and the wireless charging. The wireless charging can be classified, for example, into a magnetic resonance type, a magnetic induction type, and an electromagnetic type. An additional circuit for the wireless charging, for example, a coil loop, a resonant circuit, a rectifier, and the like, can be added.

The battery gauge can measure, for example, a residual quantity of the battery 896 and a voltage, current, and temperature during charging. The battery 896 can store or generate electricity, and can supply power to the electronic device 801 by using the stored or generated electricity. For example, the battery 896 can include a rechargeable battery or a solar battery.

The indicator 897 can indicate a specific state, for example, a booting state, a message state, a charging state, and the like, of the electronic device 801 or a part thereof (e.g., the AP 810). The motor 898 can convert an electric signal into a mechanical vibration. Although not shown, the electronic device 801 can include a processing unit (e.g., a GPU) for supporting mobile TV. The processing unit for supporting mobile TV can process media data according to a protocol of, for example, Digital Multimedia Broadcasting (DMB), Digital Video Broadcasting (DVB), media flow, and the like.

Each of the aforementioned constitutional elements of the electronic device according to various exemplary embodiments of the present disclosure can consist of one or more components, and names thereof can vary depending on a type of electronic device. The electronic device according to various exemplary embodiments of the present disclosure can include at least one of the aforementioned constitutional elements. Some of the constitutional elements can be omitted, or additional other constitutional elements can be further included. In addition, some of the constitutional elements of the electronic device according to various exemplary embodiments of the present disclosure can be combined and constructed as one entity, so as to equally perform functions of corresponding constitutional elements before combination.

A term "module" used in various exemplary embodiments of the present document can imply a unit including, for example, one of hardware, software, and firmware or a combination of two or more of them. The "module" can be interchangeably used with a term such as a unit, a logic, a logical block, a component, a circuit, and the like. The "module" can be a minimum unit of an integrally constituted component or can be a part thereof. The "module" can be a minimum unit for performing one or more functions or can be a part thereof. The "module" can be mechanically or electrically implemented. For example, the "module" of the present disclosure can include at least one of an Application-Specific Integrated Circuit (ASIC) chip, a Field-Programmable Gate Arrays (FPGAs), and a programmable-logic device, which are known or will be developed and which perform certain operations.

According to various exemplary embodiments, at least some parts of a device (e.g., modules or functions thereof) or method (e.g., operations) according to various exemplary embodiments of the present disclosure can be implemented with an instruction stored in a computer-readable storage media for example. If the instruction is executed by one or more processors (e.g., the processor 810), the one or more processors can perform a function corresponding to the instruction. The computer-readable storage media can be, for example, the memory 830. At least some parts of the programming module can be implemented (e.g., executed), for example, by the processor 810. At least some parts of the programming module can include modules, programs, routines, sets of instructions, processes, and the like, for performing one or more functions.

The computer readable recording medium may be a hardware device configured particularly to store and perform a program instruction (e.g., program module), for example, a hard disk, a magnetic medium such as a floppy disc and a magnetic tape, an optical storage medium such as a Compact Disc-ROM (CD-ROM) or a Digital Versatile Disc (DVD), a magnetic-optic medium such as a floptical disc, a Read Only Memory (ROM), a Random Access Memory (RAM), a flash memory, and the like. An example of the program instruction includes not only a machine language created by a compiler but also a high-level language executable by a computer by using an interpreter or the like. The aforementioned hardware device may be configured to operate as one or more software modules to perform the operation of the present disclosure, and the other way around is also possible.

The module or programming module according to various exemplary embodiments of the present disclosure may further include at least one or more constitutional elements among the aforementioned constitutional elements, or may omit some of them, or may further include additional other constitutional elements. Operations performed by a module, programming module, or other constitutional elements according to various exemplary embodiments of the present disclosure may be executed in a sequential, parallel, repetitive, or heuristic manner. In addition, some of the operations may be executed in a different order or may be omitted, or other operations may be added.

While the present disclosure has been shown and described with reference to certain preferred embodiments thereof, it will be understood by those skilled in the art that various changes in form and details may be made therein without departing from the spirit and scope of the disclosure as defined by the appended claims. Therefore, the scope of the present disclosure is defined not by the detailed description of the present disclosure but by the appended claims, and all differences within the scope will be construed as being included in the present disclosure.

What is claimed is:

1. An electronic device comprising:
   a substrate;
   an antenna structure including at least one antenna radiator component;
   a conductive structure included in the electronic device; and
   a conductor disposed in the antenna structure, grounding the conductive structure to a ground of the substrate, the conductor comprising:
      a first connection part exposed to the substrate;
      a second connection part extended from the first connection part, the second connection part comprising an embossing protruding toward the conductive structure and contacting the conductive structure; and
      an electrical connection member that is further formed between the ground of the substrate and the first connection part such that the ground is electronically connected to the first connection part of the conductor.

2. The electronic device of claim 1, wherein the conductor is disposed separately from the at least one antenna radiator component.

3. The electronic device of claim 1, wherein at least part of the conductor is disposed to be insert-molded to the antenna structure or to be double-injected together with the antenna structure.

4. The electronic device of claim 1, wherein the electrical connection member comprises at least one of a conductive connector, a pogo pin, a conductive tape, a conductive C clip, or a conductive urethane tape.

5. The electronic device of claim 1, wherein the conductive structure comprises at least one of a conductive frame constituting an edge of the electronic device, a battery cover covering a rear surface of the electronic device, a decoration member attached to the electronic device, or a conductive bracket arranged inside the electronic device.

6. The electronic device of claim 1, wherein the electronic device further comprises at least one of a speaker apparatus, a microphone apparatus, a vibrator, or a sensor apparatus.

7. The electronic device of claim 1, wherein the ground is an alternating current (AC) ground.

8. An electronic device comprising:
   a housing comprising a conductive frame formed along an edge of the housing;
   a substrate mounted in the housing, wherein at least part of the substrate comprises a ground; and
   an antenna carrier including at least one antenna radiator and a conductor separately disposed of the at least one antenna radiator, wherein the conductor comprises a first connection part exposed to an outside of the antenna carrier, and a second connection part exposed to the outside in a direction different from the first connection part,
   wherein the antenna carrier is disposed on the substrate such that the first connection part towards the ground of the substrate and is electronically in contact with the ground and the second connection part towards at least part of the conductive frame and is electronically in contact with the conductive frame.

9. The electronic device of claim 8, wherein the second connection part comprises an embossing protruding toward the conductive frame.

10. The electronic device of claim 8, wherein the conductor is disposed to be insert-molded to the antenna carrier, to be attached to the outside of the antenna carrier, to be double-injected together with the antenna carrier, or to allow conductive spray to be applied to an outer surface of the antenna carrier.

11. The electronic device of claim 8, further comprising an electrical connection member that is further formed between the ground of the substrate and the first connection part.

12. The electronic device of claim 11, wherein the electrical connection member comprises at least one of a conductive connector, a pogo pin, a conductive tape, a conductive C clip, an embossing protruding from the first connection part or a conductive urethane tape.

13. The electronic device of claim 8, further comprising at least one of a speaker apparatus, a microphone apparatus, a vibrator, or a sensor apparatus.

14. An electronic connection device for an electronic device comprising a substrate, an antenna device disposed near the substrate, and a conductive frame formed along an edge of the electronic device, the electronic connection device comprising:
   a conductor disposed on the antenna device, grounding the conductive frame to an alternating current (AC) ground of the substrate, the conductor comprising:
      a first connection part exposed from the antenna device to be physically in contact with the AC ground of the substrate when the antenna device is installed in the electronic device, wherein an electrical connection member is further formed between the AC ground of the substrate and the first connection part; and
      a second connection part exposed from the antenna device to be in contact with an inner surface of the conductive frame, the second connection part comprising an embossing protruding toward towards the conductive frame for making contact with the conductive frame.

* * * * *